US006937506B2

(12) United States Patent
Anthony et al.

(10) Patent No.: US 6,937,506 B2
(45) Date of Patent: Aug. 30, 2005

(54) MAGNETIC MEMORY DEVICE

(75) Inventors: Thomas C. Anthony, Sunnyvale, CA (US); Frederick A. Perner, Palo Alto, CA (US); Heon Lee, Seoul (KR)

(73) Assignee: Hewlett-Packard Development Company, L.P., Houston, TX (US)

( * ) Notice: Subject to any disclaimer, the term of this patent is extended or adjusted under 35 U.S.C. 154(b) by 2 days.

(21) Appl. No.: 10/753,539

(22) Filed: Jan. 8, 2004

(65) Prior Publication Data

US 2005/0152182 A1 Jul. 14, 2005

(51) Int. Cl.$^7$ .............................................. G11C 11/02
(52) U.S. Cl. ........................................ 365/158; 365/171
(58) Field of Search ............................... 365/158, 171, 365/63

(56) References Cited

U.S. PATENT DOCUMENTS 6,555,858 B1 * 4/2003 Jones et al. .................. 257/295
6,870,759 B2 * 3/2005 Tsang ......................... 365/158

* cited by examiner

Primary Examiner—Vu A. Le

(57) ABSTRACT

A random access memory (MRAM) that includes a magnetic memory cell that is switchable between two states under the influence of a magnetic field. The MARAM also includes an electrical bit line coupled to the magnetic memory cell for generating the magnetic field. The electrical bit line includes a conductive component and a magnetic component to guide magnetic flux associated with the magnetic field towards the magnetic memory cell. A thermal insulator is positioned between the conductive portion and the magnetic memory cell, and the magnetic component has at least one guiding portion that extends from the conductive component towards the magnetic memory cell to guide the magnetic flux around at least a portion of the thermal insulator.

18 Claims, 5 Drawing Sheets

MAGNETIC MEMORY DEVICE

FIELD OF THE INVENTION

The present invention relates to magnetic memory devices, and more specifically to methods of and structures for storing data in a magnetic memory device.

BACKGROUND OF THE INVENTION

Non-volatile memory devices such as magnetic random access memory (MRAM) devices are of interest for replacement of volatile memory devices such as dynamic random access memory (DRAM) devices. Such MRAM devices include an array of individual MRAM cells which may be tunnelling magnetoresistance memory (TMR) cells, colossal magnetoresistance memory cells (CMR) or giant magnetoresistance memory (GMR) cells.

In general, the MRAM cells include a data layer and a reference layer. The data layer is composed of a magnetic material and during a write operation the magnetisation of the data layer can be switched between two opposing states by an applied magnetic field and thus binary information can be stored. The reference layer usually is composed of a magnetic material in which the magnetisation is pinned so that the magnetic field that is applied to the data layer and in part penetrates the reference layer, is of insufficient strength to switch the magnetisation in the reference layer.

For example in a TMR cell the data layer and the reference layer are separated by a thin dielectric layer which is arranged so that a tunnelling junction is formed. The probability that electrons tunnel through the dielectric layer depends on the direction of the magnetisation in the data layer relative to the direction of the magnetisation in the reference layer. Therefore, the structure is "magnetoresistant" and stored information can be derived from the magnitude of tunnelling currents through the memory cell.

In general, it is of advantage that the magnetic memory cells are as small as possible to increase memory density and reduce cost. However, as cells become smaller, thermal stability issues become more important. To ensure that stored information is not lost because of random switching induced by environmental influences, it is necessary that the data layers of small magnetic memory cells are arranged so that the magnetic field strength that is required for switching the magnetisation is higher than that for larger memory cells. Unfortunately the necessity to generate the larger fields strength makes switching of the memory cells during the write operation more difficult.

It is known that the increasing the temperature of the magnetic memory cell lowers the magnetic field strength that is required for switching. For example, when an electrical current passes through the magnetic memory cell, heat is developed in the cell. However, the developed heat is easily conducted through the bit lines away from the memory cell and therefore cannot be utilised to facilitate switching of the magnetic memory cell.

There is therefore a need for a magnetic memory device in which loss of heat from the magnetic memory cell is reduced and therefore the heat can be utilised to facilitate switching.

SUMMARY OF THE INVENTION

Briefly, a magnetic random access memory (MRAM) embodiment of the present invention includes a magnetic memory cell that is switchable between two states under the influence of a magnetic field. The MRAM also includes an electrical bit line coupled to the magnetic memory cell for generating the magnetic field. The electrical bit line includes a conductive component and a magnetic component to guide magnetic flux associated with the magnetic field towards the magnetic memory cell. A thermal insulator is positioned between the conductive portion and the magnetic memory cell, and the magnetic medium has at least one guiding portion that extends from the conductive component towards the magnetic memory cell to guide the magnetic flux around at least a portion of the thermal insulator.

The invention will be more fully understood from the following description of embodiments of the invention. The description is provided with reference to the accompanying drawings.

DETAILED DESCRIPTION

Figure 1:
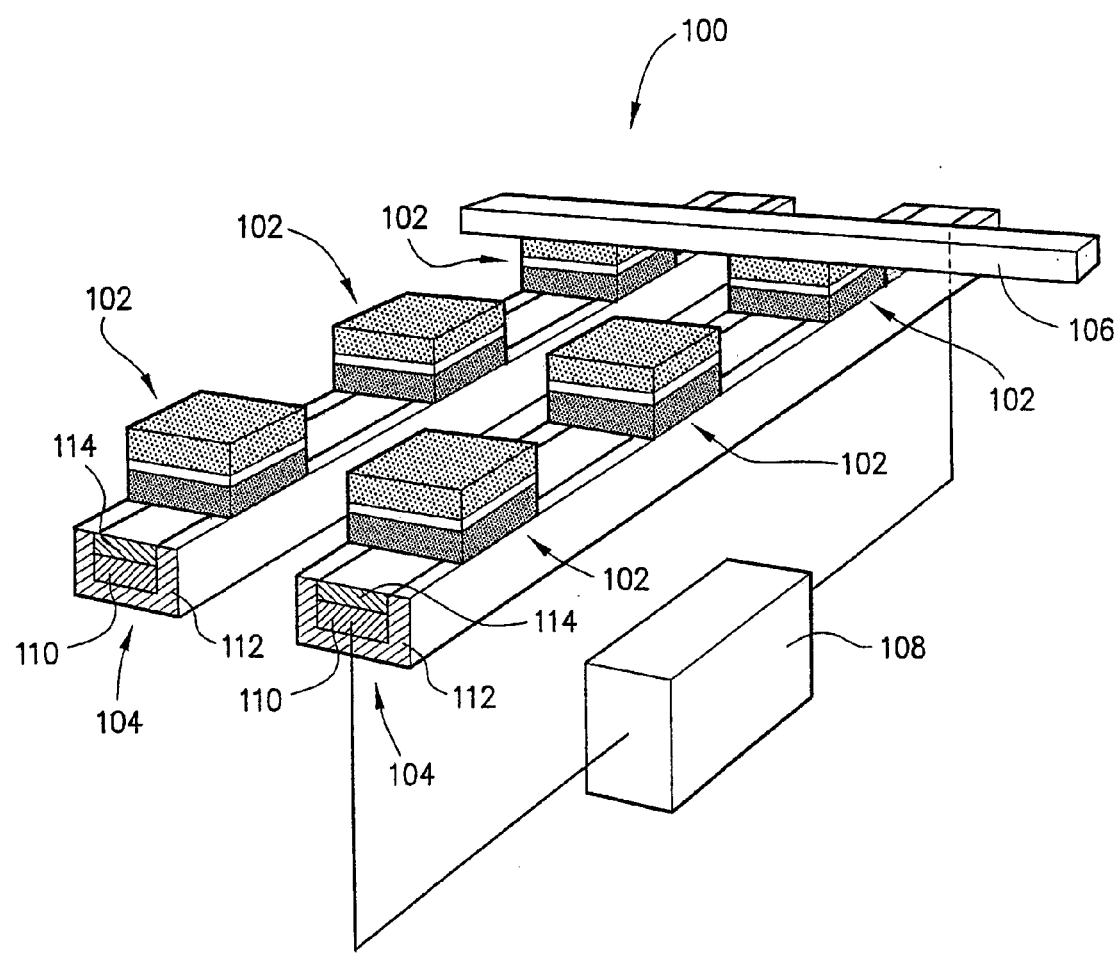
FIG. 1 is a perspective view of shows a magnetic memory device according to a specific embodiment.

FIG. 1 represents a magnetic random access memory (MRAM), which is referred to herein by the general reference numeral 100. The MRAM 100 comprises a number of magnetic memory cells 102. In this case each memory cell 102 is a tunneling magnetoresistance memory (TMR) cell. Each cell 102 is positioned on an electrically conductive bit lines 104. Each magnetic memory cell 102 is also contacted to a word line 106 (for clarity only one word line 106 is shown) so that the magnetic memory cells are sandwiched between bit lines 104 and word lines 106.

FIG. 1 schematically indicates a circuit unit 108 that generates a current through the bit lines 104. The circuit unit may also generate a current through the word lines 106 (for clarity, electrical connections to the circuit unit 110 are only shown for bit lines 104 and electrical connections for word lines 106 are not shown). As the magnetic memory cells 102 have a finite resistivity, a current may also flow between word line 108 and bit lines 104 through respective magnetic memory cells 102.

Bit lines 104 comprise a conductive core 110 and a magnetic component 112 which clads the conductive core 110. The conductive core 110 is formed from a high conductivity material such as copper and carries the electrical current that generates the magnetic field required for switching the cells 102. The device also includes a thermal insulator 114.

The magnetic cladding guides magnetic flux associated with the magnetic field that is generated in the conductive core 110 towards the magnetic memory cell so that sufficient magnetic field strength is available to facilitate switching of the magnetic memory cell.

The device 100 further includes a read circuit for sensing the resistance of selected memory cells 102 during read operations. During read operations, a constant supply voltage or a ground potential is applied to the bit line 104. The constant supply voltage may be provided by an external circuit. The read circuit is not shown in order to simplify the description.

The device 100 may comprise an array having any number of memory cells 102 arranged in any number of rows and columns. Further, the device 100 may comprise other magnetic memory cells such as colossal magnetoresistance memory cells (CMR) or giant magnetoresistance memory (GMR) cells.

Figure 2:
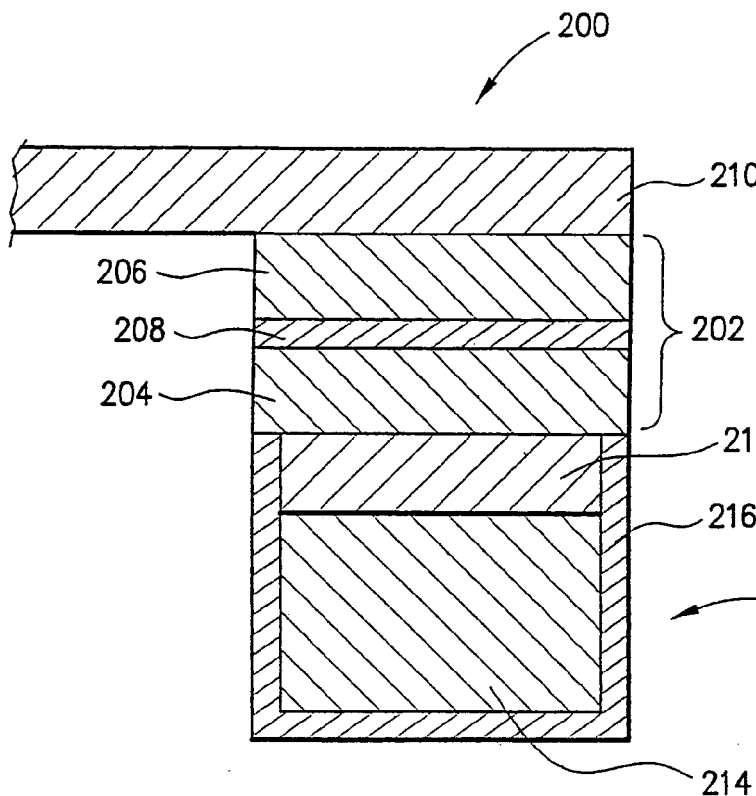
FIG. 2 is a schematic cross-sectional representation of a memory cell of a magnetic memory device according to another specific embodiment.

FIG. 2 represents a further MRAM embodiment of the present invention, and is referred to herein by the general reference numeral 200. FIG. 2 shows a portion of MARAM 200 and one memory cell 202 in more detail. The memory cell 202 comprises a data layer 204 and a reference layer 206. The reference layer 206 is composed of a magnetic material in which the direction of magnetization is pinned. The data layer 204 is composed of a magnetic material and the direction of the magnetization is switchable as a function of an applied magnetic field. Sandwiched between the data layer 204 and the reference layer 206 is a thin dielectric layer 208 so that, when a suitable electrical potential is applied, a tunneling current will flow through the dielectric layer.

In general the magnetization of the data layer 204 can have two opposing directions so that binary information can be stored as a function of the direction of the magnetic field.

The tunneling probability, and therefore the effective resistance of the memory cell, depends on the direction of the magnetization in the data layer 204 relative to that of the reference layer 206. Therefore, it is possible to determine the orientation of the magnetization in the data layer from the tunneling current which is dependent on the resistance of the memory cell 202.

The memory cell 202 is sandwiched between the word line 210 and the bit line 212. When a current is applied along bit line 212, a magnetic field will surround the bit line 212 which can be utilized to switch the magnetization of the data layer 204. Each magnetic memory cell may, comprise a number of additional layers.

Bit line 212 comprises a conductive core 214 and a magnetic component 216 which clads the conductive core 214. The conductive core 214 is formed from a high conductivity material such as copper and carries the electrical current that generates the magnetic field required for switching the magnetization of the data layer 204. The device also includes a thermal insulator 218. The magnetic cladding 216 has two distal guiding portions which are, in this embodiment, in contact with the data layer 204 and clad the thermal insulator 218.

The magnetic cladding guides magnetic flux associated with the magnetic field that is generated in the conductive core 214 towards the magnetic memory cell. Further, because of the distal guiding portions that guide the magnetic flux to the proximity of the memory cell, the conductive core 214 of the bit line can be positioned somewhat remote from the magnetic memory cell 302. Consequently, the area through which heat can escape from the magnetic memory cell into the conductive core is reduced compared with prior art devices. Heat loss of the memory cell therefore can be reduced and more heat can be utilized to facilitate switching of the magnetic memory cell. Further, as the thermal insulator 218 is disposed between the conductive core 214 and the data layer 204, heat loss of the memory cell is further reduced.

The magnetic cladding 216 of the bit line 212 has in this embodiment a substantially U-shaped-cross-sectional shape and the legs of the U-shaped cross-sectional shape are in contact with the data layer 204 so that the conductive core 214 is surrounded by the magnetic cladding 216 and the thermal insulator 218, and the thermal insulator 218 is surrounded by the core 214, the magnetic cladding 216 and the data layer 204.

For clarity FIG. 2 only shows a portion of the device 200. It is to be appreciated that the entire device comprises further features such as an array of magnetic memory cells 202 connected by word and bit lines such as 210 and 212, respectively. Further, it is to be appreciated that each magnetic memory cell may comprise a number of additional layers such as capping, AF and seed layers.

Figure 3:
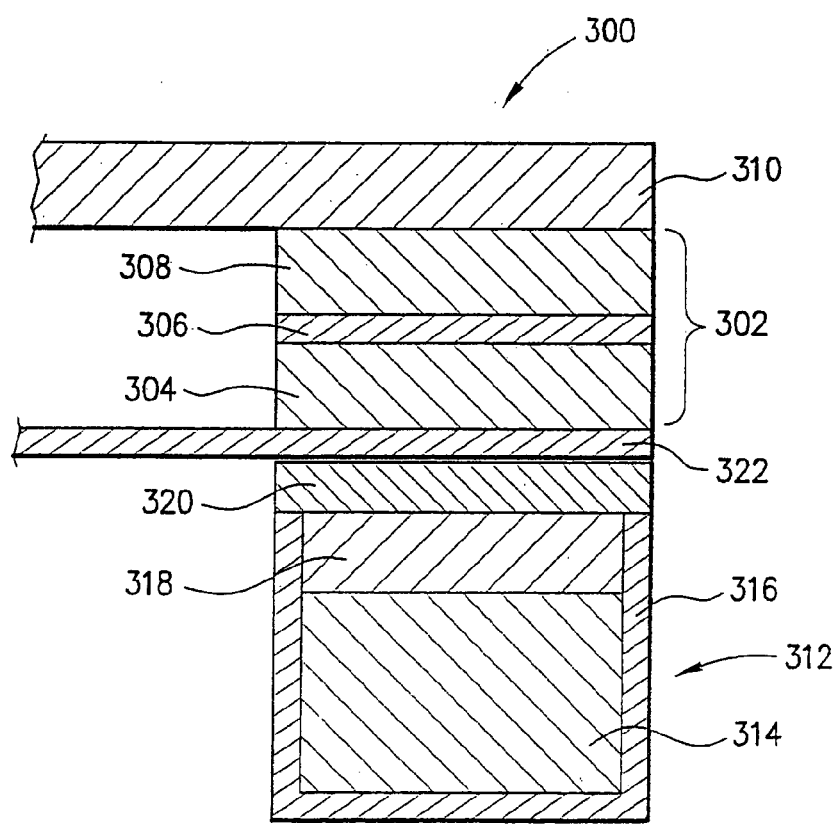
FIG. 3 is a schematic cross-sectional representation of a memory cell of a magnetic memory device according to further specific embodiment.

Referring now to FIG. 3, the MRAM according to another embodiment is now described. FIG. 3 shows a cross-sectional representation of a portion of the device 300 comprising memory cell 302 having data layer 304, dielectric layer 306 and reference layer 308. The memory cell 302 is contacted by the word line 310.

In this embodiment a bit line 312 is provided that comprises a conductive core 314 and a magnetic cladding 316. The conductive core 314 and the magnetic cladding 316 are analogous to those shown in FIG. 3 and described above. A thermal insulator 318 is disposed between the core 314 and the magnetic memory cell 302. The thermal insulator 318 is analogous to that shown in FIG. 2. The magnetic cladding 316 clads the conductive core 314 but is, in this embodiment, not in contact with the data layer 304.

An additional thermally and electrically insulating layer 320 is disposed between the magnetic cladding 316, the thermal insulator 318 and the magnetic memory cell 302. In this case the thermally insulating layer 320 and the thermal insulator 318 are in contact with each other and it is to be appreciated that both thermally insulating media 318 and 320 may be integrally formed from one material. A thin sense conductor 322 is also disposed between the data layer 304 and the thermally insulating layer 320.

In this embodiment, the legs of the U-shaped cross-sectional shape of the cladding 316 face towards the data layer 304 and are in contact with the thermally insulating layer 320. In this embodiment, the magnetic flux associated with the magnetic field generated in the conductive core 314 is guided through the legs of the cladding 316 and then penetrates the thermally insulating layer 320 and the thin sense conductor 322 before it penetrates into the data layer 304.

As the magnetic cladding 314 is not in contact with the data layer 304, heat loss from the magnetic memory cell 302 can be further reduced. In this embodiment, the thin sense conductor 322 is in contact with the data layer 304 to provide an electrical connection to read the magnetic memory cell during a read operation. The sense conductor 322 has a thickness of less than 50 nm, and the thickness typically is in the range of 5 and 20 nm. In this case sense conductor 322 is composed of titanium which has a relatively low thermal conductivity so that heat loss through the sense conductor 322 is limited. It is to be appreciated that further layers may be disposed between the magnetic material of the magnetic memory cell 302 and the bit line 312.

For clarity FIG. 3 only shows a portion of the device 300. The device comprises an array of magnetic memory cells 302 connected by a word and bit lines such as 310 and 312, respectively.

In both embodiments the magnetic claddings 216 and 316 can be composed of any suitable magnetic material and is in these cases composed of nickel-iron or cobalt-iron alloys. The conductive cores 214 and 314 are composed of a suitable conductive material such as copper. In the described embodiments the magnetic claddings 216 and 316 have a thickness of approximately 10 nm and the cores 214 and 314 have a cross-sectional area of approximately 100×200 nm. The thermally insulating material 218 and 318 and the thermally insulating layer 320 are composed of $SiO_2$ or silicon nitride but may also be composed of any other suitable thermally insulating material.

In the embodiment shown in FIG. 2 the thermal insulator 218 has a thickness of 100 nm. In the embodiment shown in FIG. 3 the thermal insulator 318 has a thickness of 100 nm and the thermally insulating material 320 has a thickness of 50 nm.

The bit lines 212 and 312 shown in FIGS. 2 and 3, respectively, may be fabricated as follows. In a Damascene process a trench is first etched in a dielectric substrate. The trench is then lined with the magnetic cladding material, followed by the deposition of copper to fill the trench. In a chemical-mechanical polishing (CMP) process the structure is then made planar. The copper is then preferentially removed from the top of the structure, either by a CMP process, wet chemical etching or ion etching. The depressions left in the copper are then filled by the thermally insulating material. The final step involves a further CMP process to create a planar surface with only magnetic cladding material and thermally insulating material (as in the case of bit line 212) exposed. In the case of bit line 312, the final step involves deposition of insulating layer 320 on top of the planarized surface. The magnetic memory cells are then fabricated on the substrate and over the bit lines using fabrication techniques known in the art.

Figure 4:
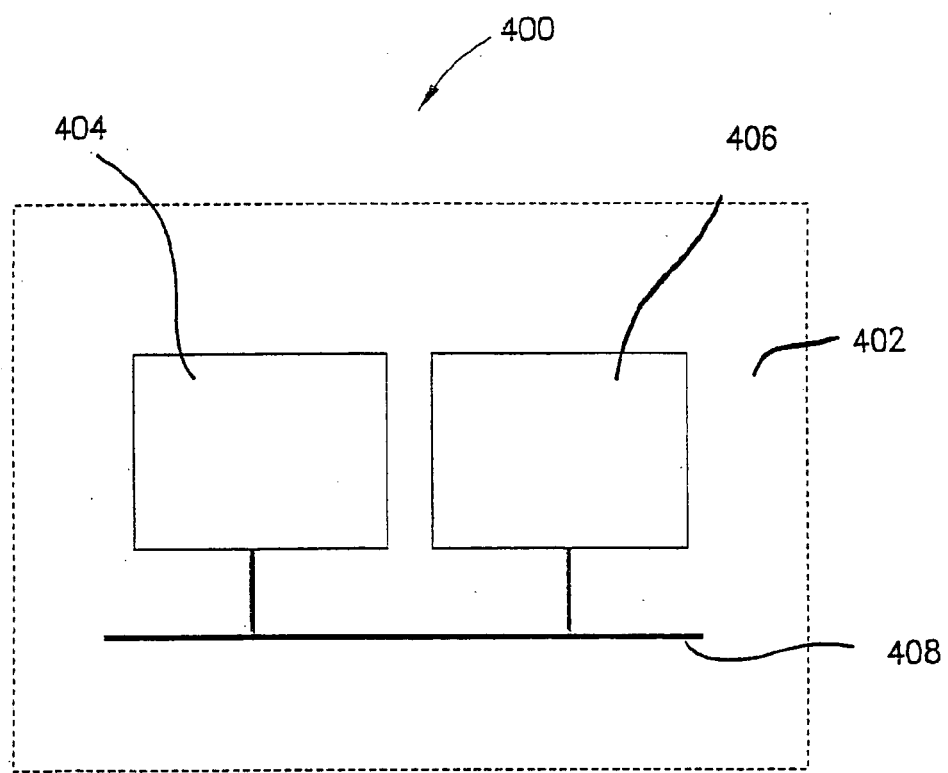
FIG. 4 is a schematic representation of a computer system embodying the magnetic memory device shown in FIG. 1.

FIG. 4 shows a computer system 400 which embodies the memory device shown in FIG. 1. The computer system 400 has a main board 402 which is connected to a central processing unit 404 and magnetic memory device arrays 406. The magnetic memory device arrays 406 includes magnetic memory device such as that shown in FIG. 1. The magnetic memory device array 406 and the central processing unit 404 are connected to a common bus 408. The computer system 404 has a range of further components which are for clarity not shown.

Figure 5:
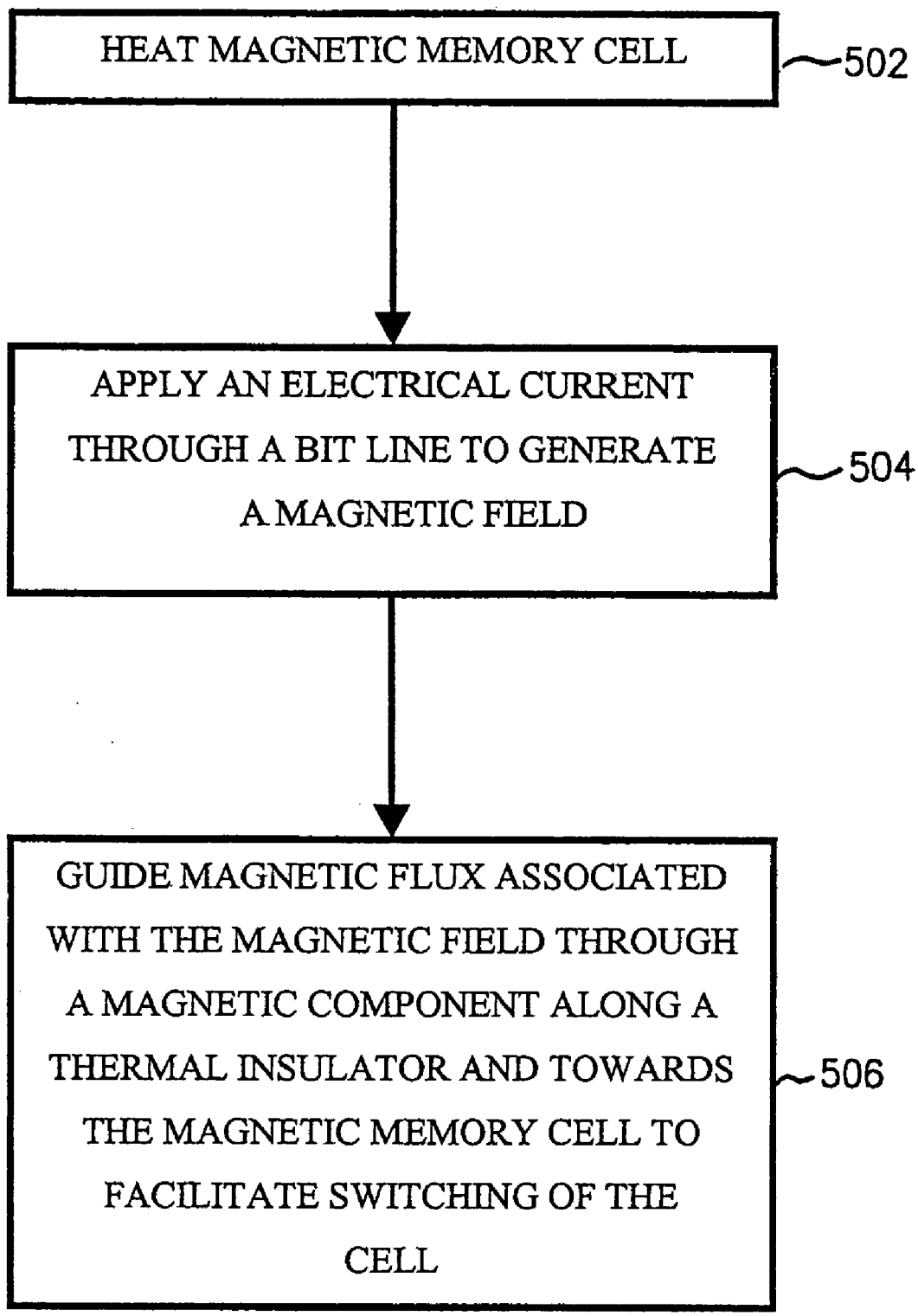
FIG. 5 is a flow-chart for a method embodiment.

FIG. 5 illustrates a method embodiment for storing data in a magnetic memory device such as device 100 shown in FIG. 1. The method includes step 502 of heating the magnetic memory cell, step 504 of applying an electrical current through the bit line of the device to generate the magnetic field, and step 506 of guiding magnetic flux associated with the magnetic field through a magnetic component along a thermal insulator and towards the magnetic memory cell to facilitate switching of the cell.

Figure 6:
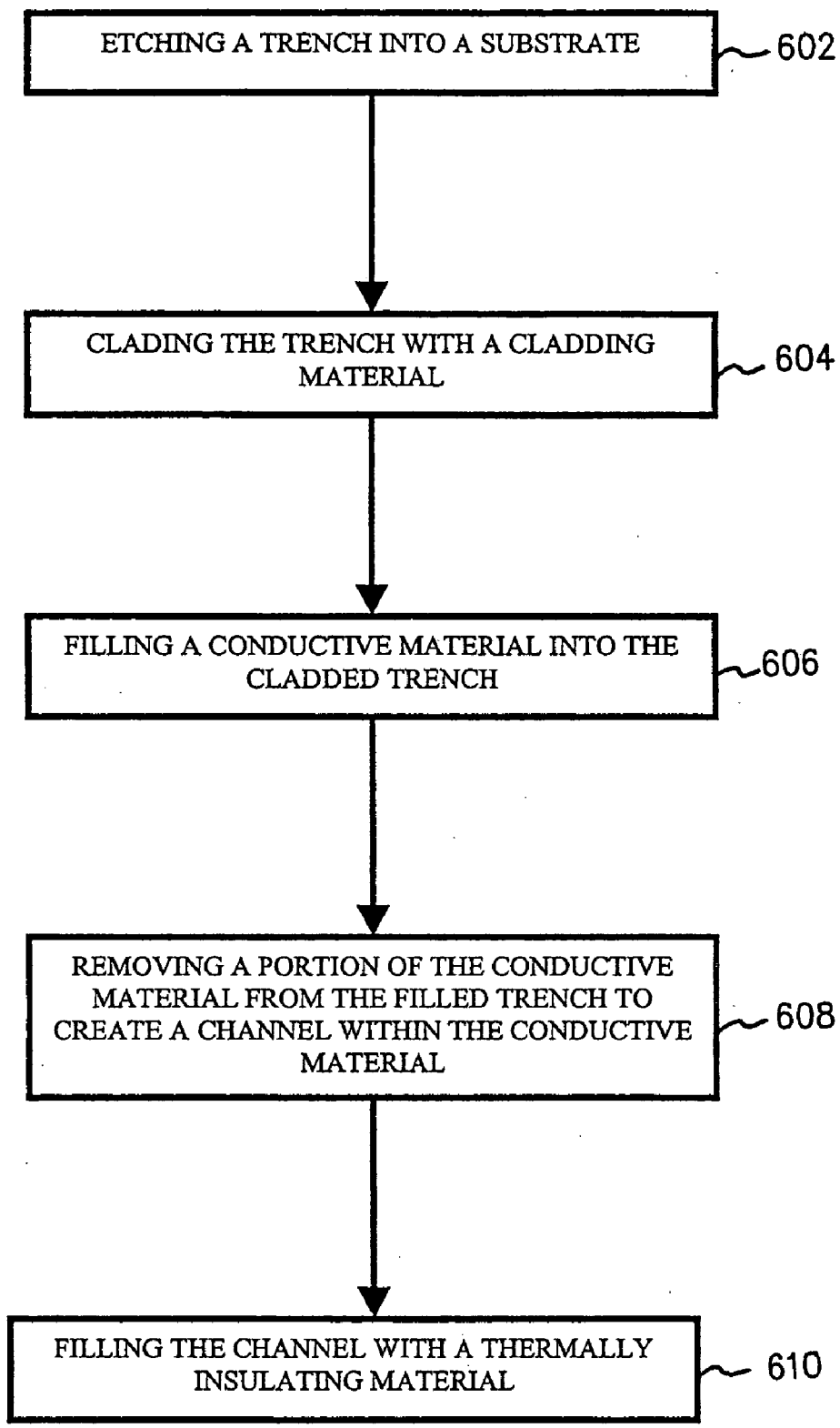
FIG. 6 is a flow-chart for a further method embodiment.

FIG. 6 illustrates a method embodiment for fabricating a conductor, such as bit line 104, for the magnetic memory device. The method includes step 602 of etching a trench into a substrate, step 604 of cladding the trench with a cladding material, step 606 of filling a conductive material into the cladded trench, step 608 of removing a portion of the conductive material from the filled trench to create a channel within the conductive material, and 610 of filling the channel with a thermally insulating material.

Although the invention has been described with reference to particular examples, it is to be appreciated by those skilled in the art that the invention may be embodied in many other forms. For example the magnetic memory cells may be colossal magnetoresistance memory cells (CMR) or giant magnetoresistance memory (GMR) cells.

Further, the magnetic component may not clad the core of the bit line. For example, the bit line may not have a core and may itself be composed of the magnetic component. In addition, insulating material may be disposed between word lines and the magnetic memory cells and the word lines may also comprise a cladding material that may surround a portion of the thermal insulator. Also, it is to be appreciated that it may not be necessary to align the layers of the devices 200 and 300 as shown in FIGS. 2 and 3. For example, at least one of the distal guiding portions of each magnetic components 216 and 316, respectively may not be in contact with the insulating materials 218 and 318 respectively so that the magnetic flux is guided asymmetrically towards the respective magnetic memory cells.

What is claimed is:

1. A magnetic random access memory (MRAM) device, comprising:
    a magnetic memory cell switchable between two states under the influence of a magnetic field;
    an electrical bit line coupled to the magnetic memory cell for generating the magnetic field, the electrical bit line comprising a conductive component and a magnetic component to guide magnetic flux associated with the magnetic field towards the magnetic memory cell;
    a thermal insulator positioned between the conductive component and the magnetic memory cell, and the magnetic component having at least one guiding portion that extends from the conductive component towards the magnetic memory cell to guide the magnetic flux around at least a portion of the thermal insulator.

2. The MRAM of claim 1, wherein:
the at least one guiding portion extends along a portion of the thermal insulator.

3. The MRAM of claim 1, wherein:
the magnetic component and the conductive component are integrally formed from one magnetic and conductive material.

4. The MRAM of claim 1, wherein:
the conductive component is a conductive core and the magnetic component is disposed around at least a portion of the core.

5. The MRAM of claim 4, wherein:
the magnetic component clads the conductive core.

6. The MRAM of claim 5, wherein:
the magnetic component has two guiding portions that extend from the conductive core.

7. The MRAM of claim 5, wherein:
the magnetic component is of a substantially U-shaped cross-sectional shape.

8. The MRAM of claim 1, wherein:
the magnetic component is in contact with magnetic material of the magnetic memory cell.

9. The MRAM of claim 6, wherein:
the at least one guiding portion of the magnetic component is in contact with the magnetic memory cell.

10. The MRAM of claim 1, wherein:
the magnetic component is disposed remote from the magnetic memory cell.

11. The MRAM of claim 10, wherein:
a thermal insulation layer is disposed between the magnetic memory cell and the magnetic component.

12. The MRAM of claim 11, wherein:
the at least one guiding portion is in contact with the thermal insulation layer.

13. The MRAM of claim 12, wherein:
a sense-conductor that is electrically connected to the magnetic material of the magnetic memory cell is disposed between the magnetic memory cell and the thermal insulation layer.

14. The MRAM of claim 1, wherein the MRAM device is one of an array of magnetic memory devices.

15. A computer system comprising:
   a central processing unit,
   a main board coupled to the central processing unit and a plurality of magnetic memory devices coupled to the main board, each magnetic memory device comprising:
   a magnetic memory cell switchable between two states under the influence of a magnetic field;
   an electrical bit line coupled to the magnetic memory cell for generating the magnetic field, the electrical bit line comprising a conductive component and a magnetic component to guide magnetic flux associated with the magnetic field towards the magnetic memory cell;
   a thermal insulator positioned between the conductive component and the magnetic memory cell, and the magnetic component having at least one guiding portion that extends from the conductive component towards the magnetic memory cell to guide the magnetic flux around at least a portion of the thermal insulator.

16. A method of storing data in a magnetic memory device of the type having a magnetic memory cell switchable between two states on the application of a magnetic field to the cell, and a bit line for the generation of the magnetic field, the method comprising the steps of:
   heating the magnetic memory cell,
   applying an electrical current through the bit line to generate the magnetic field, and
   guiding magnetic flux associated with the magnetic field through a magnetic component along a thermal insulator and towards the magnetic memory cell to facilitate switching of the cell.

17. The method of claim 16 wherein:
   the step of guiding the magnetic flux through the magnetic component is conducted so that the magnetic flux is guided from the magnetic component directly to the magnetic material of the magnetic memory cell.

18. The method of claim 16, wherein:
   the step of guiding the magnetic flux through the magnetic component is conducted so that the magnetic flux is guided through the magnetic component and then penetrates through additional material that is disposed between the magnetic component and the magnetic material of the magnetic memory cell before the magnetic flux penetrates the magnetic memory cell.

* * * * *